(12) United States Patent
Hamada

(10) Patent No.: US 6,630,853 B1
(45) Date of Patent: Oct. 7, 2003

(54) SEMICONDUCTOR INTEGRATED CIRCUIT INCLUDING CONDITIONAL CLOCKING FLIP-FLOP CIRCUIT

(75) Inventor: Mototsugu Hamada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/230,308

(22) Filed: Aug. 29, 2002

(30) Foreign Application Priority Data

Jul. 23, 2002 (JP) ..................................... 2002-214326

(51) Int. Cl.[7] .............................................. H03K 3/037
(52) U.S. Cl. ........................ 327/202; 327/211; 327/212
(58) Field of Search ................................ 327/199, 200, 327/201–212, 218, 225, 3, 5, 12; 331/25; 375/375, 376

(56) References Cited

U.S. PATENT DOCUMENTS

| 4,422,176 A | * 12/1983 | Summers ..................... 375/376 |
| 4,535,459 A | * 8/1985 | Hogge, Jr. ................... 375/324 |
| 5,027,085 A | * 6/1991 | DeVito ........................ 331/1 A |
| 5,799,048 A | * 8/1998 | Farjad-Rad et al. ......... 375/360 |
| 6,204,707 B1 | 3/2001 | Hamada et al. ............. 327/202 |

OTHER PUBLICATIONS

Mototsugu Hamada, et al., "Flip–Flop Selection Technique for Power–Delay Trade–off", 1999 IEEE International Solid–State Circuits Conference, ISSCC Tech. Digest, Feb. 1999, TP 15.8.

* cited by examiner

*Primary Examiner*—Minh Nguyen
(74) *Attorney, Agent, or Firm*—Oblon, Spivak, McClelland, Maier & Neustadt, P.C.

(57) ABSTRACT

A semiconductor integrated circuit including: a first latch to pass or store a signal in accordance with a logic value of a first internal clock signal; a second latch connected in series to the first latch, to pass or store a signal in accordance with a logic value of a second internal clock signal, with inverted operational characteristics in regard to the first latch; comparators to compare signal logic values at signal-input and -output nodes of the first latch; and the second latch; a first clock controller to generate a signal having a specific logic value in dependence on whether nodes of the first latch have the same or different signal logic values, as the first internal clock signal, based on the output of the first comparator; and a second clock controller to generate a signal having a specific logic value in dependence on whether nodes of the second latch have different signal logic values, as the second internal clock signal, based on the output of the second comparator.

9 Claims, 5 Drawing Sheets

SEMICONDUCTOR INTEGRATED CIRCUIT INCLUDING CONDITIONAL CLOCKING FLIP-FLOP CIRCUIT

CROSS REFERENCE TO RELATED APPLICATION

This application is based upon and claims the benefit of priority from the prior Japanese Patent Application No. 2002-214326 filed on Jul. 23, 2002; the entire contents of which are incorporated herein by reference.

BACKGROUND OF THE INVENTION

The present invention relates to a semiconductor integrated circuit, particularly, a flip-flop circuit.

FIGS. 1A and 1B show a known flip-flop circuit. In detail, FIG. 1A and FIG. 1B show a signal-transfer circuit and a clock-supply circuit, respectively, of the known flip-flop circuit.

The signal-transfer circuit has a first clocked inverter INV21, the input node thereof being connected to an input D; a first inverter INV22 connected in series to the output node of the first clocked inverter INV21; a second clocked inverter INV23 interconnected with the first inverter INV22; a transmission gate TG21 connected in series to the output node of the first inverter INV22; a second inverter INV24 connected in series to the output node of the transmission gate TG21; a third clocked inverter INV25 interconnected with the second inverter INV24; and a third inverter INV26 connected in series to the output node of the second inverter INV24, the output of the third inverter INV26 being connected to an output Q.

The clock-supply circuit has a fourth inverter INV27, the input node thereof being connected to a supply node for a clock signal CLK and a fifth inverter INV28 connected in series to the output node of the fourth inverter INV27. An internal clock signal CKI is generated at the output node of the fifth inverter INV28 and an inverted internal clock signal CKIB is generated at the output node of the fourth inverter INV27.

The internal clock signal CKI is supplied to N-channel MOS transistors of the second clocked inverter INV23 and the transmission gate TG21 and also P-channel MOS transistors of the first and the third clocked inverters INV21 and INV25. The inverted internal clock signal CKIB is supplied to N-channel MOS transistors of the first and the third clocked inverters INV21 and INV25 and also P-channel MOS transistors of the second clocked inverter INV23 and the transmission gate TG21.

Shown in FIGS. 1A and 1B are the internal clock and inverted clock signals supplied only to the N-channel MOS transistors for brevity.

A low-level clock signal CLK causes generation of a low-level internal clock signal CKI and a high-level inverted internal clock signal CKIB. On the contrary, a high-level clock signal CLK causes generation of a high-level internal clock signal CKI and a low-level inverted internal clock signal CKIB.

An input signal supplied via the input D is supplied to the first inverter INV22 via the first clocked inverter INV21 when the clock signal CLK is at a low level, or the inverted clock signal CKBI at a high level. The input signal supplied to the first inverter INV22 is inhibited from being output therefrom because the transmission gate TG21 and the second clocked inverter INV23 have been turned of f by the low-level internal clock signal CKI.

On switching from the low to high level for the clock signal CLK, the first clocked inverter INV21 is turned off whereas the transmission gate TG21 and the second clocked inverter INV23 is turned on. Therefore, on switching of the clock signal CLK, the input signal supplied via the input D is held by the first inverter INV22 and the second clocked inverter INV23 and further output from the output Q through the transmission gate TG21 and the second and the third inverters INV24 and INV26.

Next, on switching from the high to low level for the clock signal CLK, the transmission gate TG21 is turned off whereas the third clocked inverter INV25 is turned on. Therefore, on switching of the clock signal CLK, the input signal passed through the transmission gate TG21 is held by the second inverter INV24 and the third clocked inverter INV25 and further output from the output Q through the third inverter INV26. This signal-transfer state continues until the transmission gate TG21 is turned on again to receive another level of signal.

Any skilled in the art knows that flip-flop circuits consume much power in a large-scale integrated circuit (LSI).

The known flip-flop circuit shown in FIGS. 1A and 1B is charged and discharged at several nodes in accordance with operations based on the clock signal CLK, thus consuming power. Twelve transistors are charged and discharged among 24 transistors in total, for example, for the flip-flop circuit shown in FIGS. 1A and 1B, thus consuming power even if the input-signal level via the input D does not vary, which is about 40% of power consumed when the signal level varies.

The inventors Hamada et al. disclose a low-power-consuming flip-flop circuit in Japanese Unexamined Patent Publication No. 10-240713 corresponding to U.S. Pat. No. 6,204,707.

FIG. 2 shows a circuit block diagram of the disclosed flip-flop circuit.

The low-power-consuming flip-flop circuit has a first inverter INV4 1, the input node thereof being connected to an input D; a transmission gate TG31 connected in series to the output node of the first inverter INV41; a second inverter INV42 connected in series to the output node of the transmission gate TG31; a first clocked inverter INV43 interconnected with the second inverter INV42; and a third inverter INV44 connected in series to the output node of the transmission gate TG31, the output of the third inverter INV44 being connected to an output Q.

The first and the second inverters INV41 and INV42 and the first clocked inverter INV43 and also the transmission gate TG31 constitute a latch as a signal-transfer circuit. An output Q is generated at the output node of the third inverter INV44 for steady signal supply, although it can be generated at the output node of the second inverter INV42.

The low-power-consuming flip-flop circuit also has a pair of a first N-channel MOS transistor NM21 and a first P-channel MOS transistor PM21 connected in parallel, the drain of the MOS transistor NM21 and also the source of the MOS transistor PM21 being connected to the output node of the transmission gate TG31, the gate of the MOS transistor NM21 being connected to the output node of the first inverter INV41, the gate of the MOS transistor PM21 being connected to the input D; and another pair of a second N-channel MOS transistor NM22 and a second P-channel MOS transistor PM22 connected in parallel, the drain of the MOS transistor NM22 and also the source of the MOS transistor PM22 being connected to the output node of the second inverter INV42, the gate of the MOS transistor NM22 being connected to the input D, the gate of the MOS transistor PM22 being connected to the output node of the first inverter INV41.

The pair of the first N-channel MOS transistor NM21 and the first P-channel MOS transistor PM21 and the other pair of the second N-channel MOS transistor NM22 and the second P-channel MOS transistor PM22 constitute an EX-NOR logic circuit EX-NOR3 for an exclusive-NOR operation to the D- and Q-inputs.

Moreover, the low-power-consuming flip-flop circuit has a 2-input AND logic circuit AND21, a clock signal CK being supplied to one of the inputs thereof; a 2-input NOR logic circuit NOR21, connected to one of the inputs thereof being the source of the first N-channel MOS transistor NM21, the drain of the first P-channel MOS transistor PM21, the source of the second N-channel MOS transistor NM22 and the drain of the second P-channel MOS transistor PM22, connected to the other input of the 2-input NOR logic circuit NOR 21 being the output node of the AND logic circuit AND21; a 2-input NAND logic circuit NAND21, the clock signal CLK being supplied to one of the inputs thereof, connected to the other input thereof being the output node of the NOR logic circuit NOR21; a fourth inverter INV45, connected to the input thereof being the output node of the NOR logic circuit NOR21, the output node thereof being connected to the other input of the AND logic circuit AND21; and a fifth inverter INV46 connected in series to the output node of the NAND logic circuit NAND21, constituting a clock-control circuit CLK-CTRL3.

An internal clock signal CKI is generated at the output node of the fifth inverter INV46 and an inverted internal clock signal CKIB is generated at the output node of the NAND logic circuit NAND21.

The internal clock signal CKI is supplied to N-channel MOS transistors of the transmission gate TG31 and also P-channel MOS transistors of the first clocked inverter INV43. The inverted internal clock signal CKIB is supplied to N-channel MOS transistors of the first clocked inverter INV43 and also P-channel MOS transistors of the transmission gate TG31.

Shown in FIG. 2 are the internal clock and inverted clock signals supplied only to the N-channel MOS transistors for brevity.

In the low-power-consuming flip-flop circuit shown in FIG. 2, the EX-NOR logic circuit EX-NOR3 compares the input D and the output Q to generate a logic signal indicating a logic value in accordance with the result of the comparison, for control over the clock-control circuit CLK-CTRL3. The internal clock and inverted internal clock signals CKI and CKIB derived from the clock signal CLK are supplied to the signal-transfer circuit only when the input D is different from the output Q in logic value, for low power consumption.

The low-power-consuming flip-flop circuit shown in FIG. 2 has a single latch with a limited number of transistors as the signal-transfer circuit, however, includes a large number of transistors for the clock-control circuit CLK-CTRL3.

SUMMARY OF THE INVENTION

A semiconductor integrated circuit according to one embodiment of the present invention comprises:
  a first latch to pass or store a signal in accordance with a logic value of a first internal clock signal;
  a second latch connected in series to the first latch, to store or pass a signal in accordance with a logic value of a second internal clock signal, with operational characteristics which is an inversion of operational characteristics of the first latch;
  a first comparator to compare signal logic values at signal-input and -output nodes of the first latch;
  a second comparator to compare signal logic values at signal-input and -output nodes of the second latch;
  a first clock controller to generate a signal having a specific logic value for storing the signal when the signal-input and -output nodes of the first latch have a specific same signal logic value whereas generate a specific clock signal when the signal-input and -output nodes of the first latch have different signal logic values, as the first internal clock signal, under a result of comparison by the first comparator; and
  a second clock controller to generate a signal having a specific logic value for storing the signal when the signal-input and -output nodes of the second latch have a specific same signal logic value whereas generate the specific clock signal when the signal-input and -output nodes of the second latch have different signal logic values, as the second internal clock signal, under a result of comparison by the second comparator.

A semiconductor integrated circuit according to one detailed embodiment of the present invention comprises:
  a first latch having a clock-input node, an input node connected to an input D and an output node connected to a node X, to pass a signal while a first internal clock signal supplied to the clock-input node is being at a first level whereas store the signal while the first internal clock signal is being at a second level;
  a second latch having a clock-input node, an input node connected to the node X and an output node connected to an output Q, to pass a signal while a second internal clock signal supplied to the clock-input node is being at the second level whereas store the signal while the second internal clock signal is being at the first level;
  a first comparator having an input receiving the input D and another input connected to the node X;
  a first clock controller having an input connected to an output node of the first comparator and another input receiving a specific clock signal, to generate the first internal clock signal;
  a second comparator having an input connected to the node X and another input receiving the output Q; and
  a second clock controller having an input connected to an output node of the second comparator and another input receiving the specific clock signal, to generate the second internal clock signal.

DETAILED DESCRIPTION OF EMBODIMENTS

Embodiments of semiconductor integrated circuit according to the present invention will be disclosed with reference to the attached drawings.

Figure 1A:
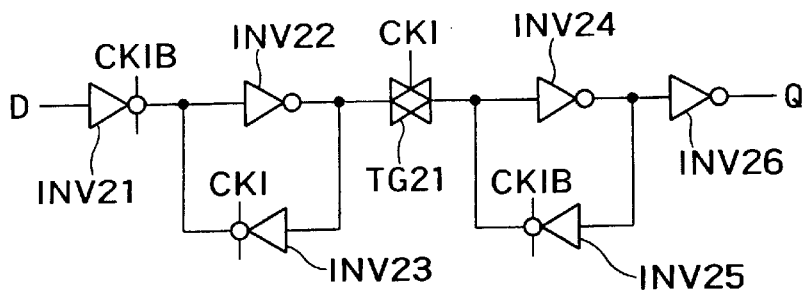
FIGS. 1A and 1B show a known flip-flop circuit.
Figure 1B:
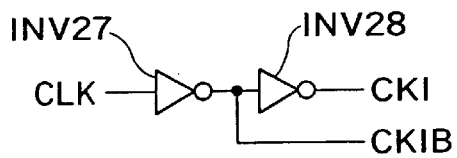
Figure 2:
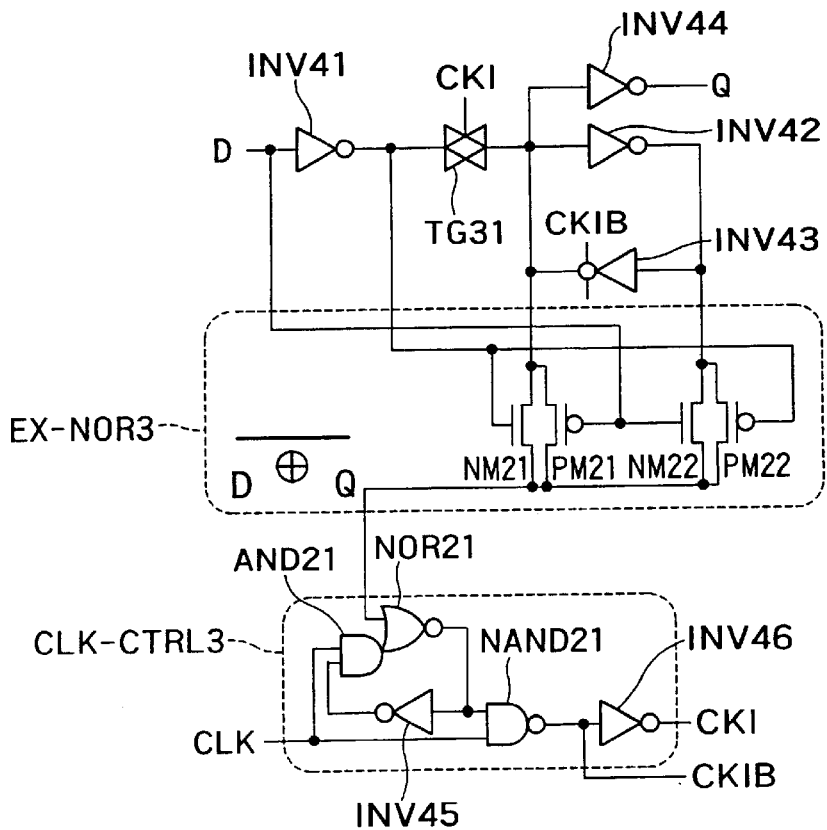
FIG. 2 shows a circuit diagram of another known flip-flop circuit.
Figure 3:
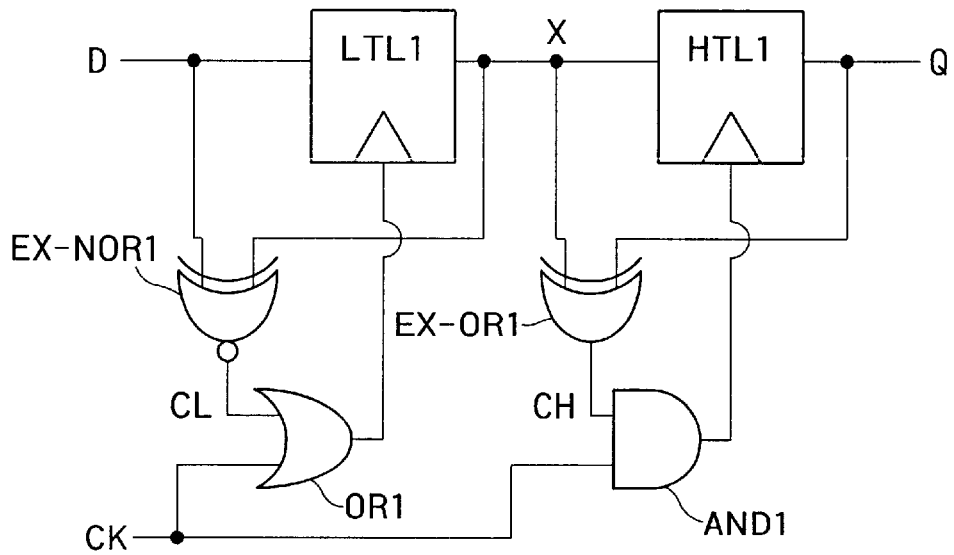
FIG. 3 shows a block diagram of a flip-flop circuit as a first embodiment according to the present invention.

FIG. 3 shows a block diagram of a flip-flop circuit as a first embodiment according to the present invention.

The flip-flop circuit as the first embodiment according to the present invention has a first latch circuit LTL1, the input node thereof being connected to an input D, the output node thereof being connected to a node X, which passes a signal therethrough while a low (first)-level first internal clock signal is being supplied to its clock-input node, whereas stores a signal while a high (second)-level first internal clock signal is being supplied to the clock-input node; a second latch circuit HTL1, the input node thereof being connected to the node X, the output node thereof being connected to an output Q, which passes a signal therethrough while a high-level second internal clock signal is being supplied to its clock-input node, whereas stores a signal while a low-level second internal clock signal is being supplied to the clock-input node; a 2-input EX-NOR logic circuit EX-NOR1 (a first comparator), one of the two inputs thereof receiving an input D, the other input thereof being connected to the node X; a 2-input OR logic circuit OR1 (a first controller), one of the two inputs thereof being connected to the output node CL of the EX-NOR logic circuit EX-NOR1, the other input thereof receiving a clock signal CK, which generates a first internal clock signal; an EX-OR logic circuit EX-OR1 (a second comparator), one of the two inputs thereof being connected to the node X, the other input thereof receiving an output Q; and a 2-input AND logic circuit AND1 (a second clock controller), one of the two inputs thereof being connected to the output node CH of the EX-OR logic circuit EX-OR1, the other input thereof receiving the clock signal CK, which generates a second internal clock signal.

Figure 4:
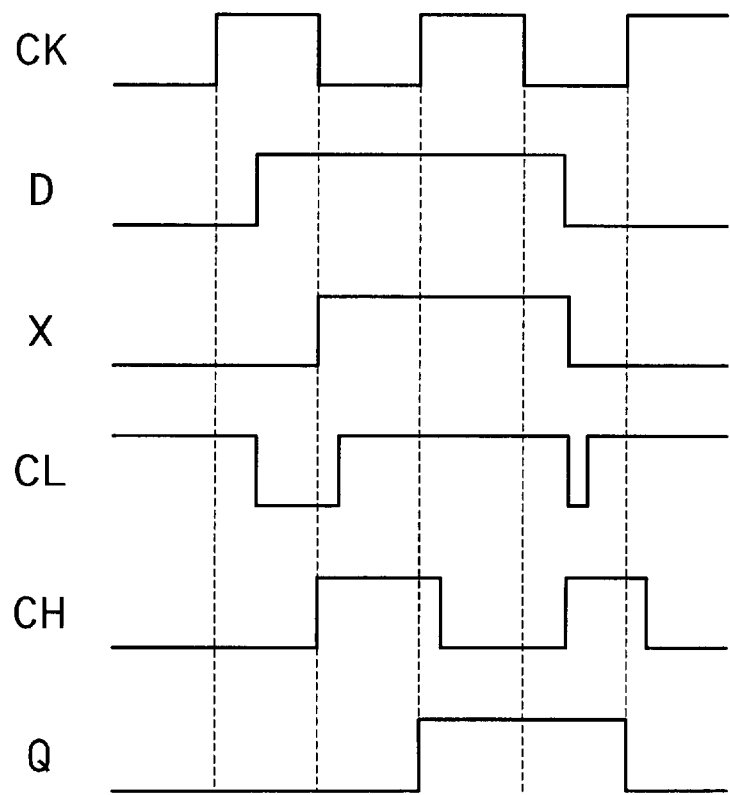
FIG. 4 shows a timing chart indicating an operation of the flip-flop circuit as the first embodiment of the present invention.

FIG. 4 shows a timing chart indicating an operation of the flip-flop circuit as the first embodiment of the present invention.

Disclosed below with reference to FIGS. 3 and 4 is the operation of the flip-flop circuit as the first embodiment of the present invention.

The EX-NOR logic circuit EX-NOR1 generates a high-level output at the output node CL when the input D and the node X have the same logic value, thus a high-level first internal clock signal being supplied to the first latch circuit LTL1. This gives the same logic value to the node X and the output Q, which causes the EX-OR logic circuit EX-OR1 to generate a low-level output at the output node CH, thus a low-level second internal clock signal being supplied to the second latch circuit HTL1. Therefore, logically-correct first and second internal clock signals to be supplied to the first and the second latch circuits LTL1 and HTL1, respectively, are blocked by the OR logic circuit OR1 and the AND logic circuit AND1, each connected to the clock-input node of the corresponding latch circuit.

On the contrary, the EX-NOR logic circuit EX-NOR1 generates a low-level output at the output node CL when the input D and the node X have different logic values, thus the first internal clock signal supplied to the first latch circuit LTL1 being at the same level as the clock signal CK. A low-level clock signal CK gives the same logic value to the node X and the input D, thus the EX-NOR logic circuit EX-NOR1 generating a high-level output at the output node CL.

This results in different logic values at the node X and the output Q, thus the EX-OR logic circuit EX-OR1 generating a high-level output at the output node CH, which gives a signal level the same as the clock signal CK to the internal clock signal supplied to the second latch circuit HTL1. A high-level clock signal CK gives the same logic value to the node X and the output Q, thus an input D being generated as an output Q as being synchronized with a rising moment of the clock signal CK.

As disclosed above, the flip-flop circuit as the first embodiment of the present invention performs a usual D-type flip-flop operation while blocks logically-correct clock signals in front of the latch circuits constituting a flip-flop, when the input D and the output Q have the same logic value, thus eliminating unnecessary operations and hence achieving low-power consumption.

Figure 5:
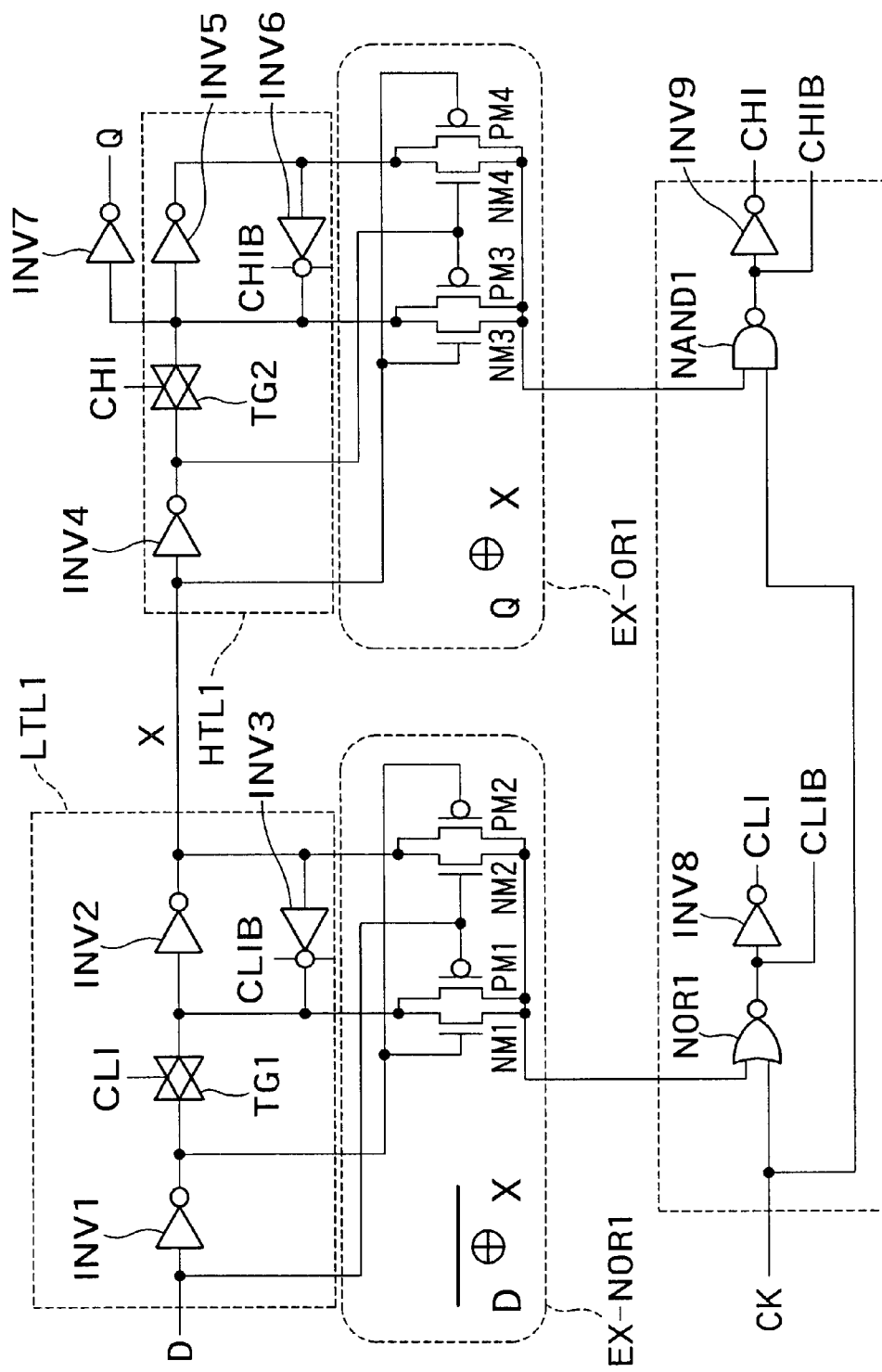
FIG. 5 is a detailed circuit diagram of the flip-flopcircuit as the first embodiment of the present invention.

FIG. 5 is a detailed circuit diagram of the flip-flop circuit as the first embodiment of the present invention.

The detailed circuit diagram of the flip-flop circuit as the first embodiment of the present invention shown in FIG. 5 has the first and the second latch circuits LTL1 and HTL1, the EX-NOR logic circuit EX-NOR1, the EX-OR logic circuit EX-OR1 and also a clock-control circuit CLK-CTRL1, in accordance with the flip-flop circuit as the first embodiment of the present invention shown in FIG. 3.

The first latch circuit LTL1 has a first inverter INV1, the input node thereof being connected to an input D; a first transmission gate TG1 connected in series to the output node of the first inverter INV1; a second inverter INV2 connected in series to the output node of the first transmission gate TG1, the output of the second inverter INV2 being connected to a node X; and a first clocked inverter INV3 interconnected with the second inverter INV2 in which the output node of the second inverter INV2 is connected to the input node of the first clocked inverter INV3 and the output node of the first clocked inverter INV3 is connected to the input node of the second inverter INV2.

The second latch circuit HTL1 has a third inverter INV4, the input node thereof being connected to the node X; a second transmission gate TG2 connected in series to the output node of the third inverter INV4; a fourth inverter INV5 connected in series to the output node of the second transmission gate TG2; a second clocked inverter INV6 interconnected with the fourth inverter INV5 in which the output node of the fourth inverter INV5 is connected to the input node of the second clocked inverter INV6 and the output node of the second clocked inverter INV6 is connected to the input node of the fourth inverter INV5; and a seventh inverter INV7, the output node thereof being connected to an output Q.

An output Q is generated at the output node of the seventh inverter INV7 for steady output Q supply, although it can be generated at the output node of the fourth inverter INV5. The seventh inverter INV7 may be omitted in arrangements for generating an output Q at the output node of the fourth inverter INV5.

The EX-NOR logic circuit EX-NOR1 has a pair of a first N-channel MOS transistor NM1 and a first P-channel MOS transistor PM1 connected in parallel, the drain of the MOS transistor NM1 and also the source of the MOS transistor PM1 being connected to the output node of the first transmission gate TG1, the gate of the MOS transistor NM1 being connected to the output node of the first inverter INV1, the gate of the MOS transistor PM1 being connected to the input D; and another pair of a second N-channel MOS transistor NM2 and a second P-channel MOS transistor PM2 connected in parallel, the drain of the MOS transistor NM2 and also the source of the MOS transistor PM2 being connected to the node X, or the output node of the second inverter INV2, the gate of the MOS transistor NM2 being connected to the input D, the gate of the MOS transistor PM2 being connected to the output node of the first inverter INV1.

The EX-NOR logic circuit EX-NOR1 performs an exclusive-NOR operation to the signals at the input D and the node X.

The EX-OR logic circuit EX-OR1 has a pair of a third N-channel MOS transistor NM3 and a third P-channel MOS transistor PM3 connected in parallel, the drain of the MOS transistor NM3 and also the source of the MOS transistor PM3 being connected to the output node of the second transmission gate TG2, the gate of the MOS transistor NM3 being connected to the input node of the third inverter INV4, the gate of the MOS transistor PM3 being connected to the output node of the third inverter INV4; and another pair of a fourth N-channel MOS transistor NM4 and a fourth P-channel MOS transistor PM4 connected in parallel, the drain of the MOS transistor NM4 and also the source of the MOS transistor PM4 being connected to the output node of the fourth inverter INV5 (or allowed to be connected to the output Q), the gate of the MOS transistor NM4 being connected to the output node of the third inverter INV4, the gate of the MOS transistor PM4 being connected to the input node of the-third inverter INV4.

The EX-OR logic circuit EX-OR1 performs an exclusive-OR operation to the signals at the node X and the output Q.

The clock-control circuit CLK-CTRL1 has a NOR logic circuit NOR1, one of the two inputs thereof receiving a clock signal CK, the other input thereof being connected to the source of the first N-channel MOS transistor NM1, the drain of the first P-channel MOS transistor PM1, the source of the second N-channel MOS transistor NM2 and the drain of the second P-channel MOS transistor PM2; a fifth inverter INV8 connected in series to the output node of the NOR logic circuit NOR1; a NAND logic circuit NAND1, one of the two inputs thereof receiving the clock signal CK, the other input thereof being connected to the source of the third N-channel MOS transistor NM3, the drain of the third P-channel MOS transistor PM3, the source of the fourth N-channel MOS transistor NM4 and the drain of the fourth P-channel MOS transistor PM4; and a sixth inverter INV9 connected in series to the output node of the NAND logic circuit NAND1.

A first internal clock signal CLI is generated at the output node of the fifth inverter INV8. A first inverted internal clock signal CLIB is generated at the output node of the NOR logic circuit NOR1. A second internal clock signal CHI is generated at the output node of the sixth inverter INV9. Moreover, a second inverted internal clock signal CHIB is generated at the output node of the NAND logic circuit NAND1.

The first internal clock signal CLI is supplied to N-channel MOS transistors of the first transmission gate TG1 and also P-channel MOS transistors of the first clocked inverter INV3. The first inverted internal clock signal CLIB is supplied to N-channel MOS transistors of the first clocked inverter INV3 and also P-channel MOS transistors of the first transmission gate TG1.

The second internal clock signal CLI is supplied to N-channel MOS transistors of the second transmission gate TG2 and also P-channel MOS transistors of the second clocked inverter INV6. The second inverted internal clock signal CLIB is supplied to N-channel MOS transistors of the second clocked inverter INV6 and also P-channel MOS transistors of the second transmission gate TG2.

Shown in FIG. 5 are the internal clock and inverted internal clock signals supplied only to the N-channel MOS transistors for brevity.

The flip-flop circuit as the first embodiment of the present invention shown in FIG. 5 operates in the same way as the basic operation of the counterpart shown in FIG. 3. Moreover, the flip-flop circuit shown in FIG. 5 is a detailed circuit for the first embodiment of the present invention shown in FIG. 3, and hence any modifications can be made to the configuration as long as meeting the same operational requirements.

Figure 6:
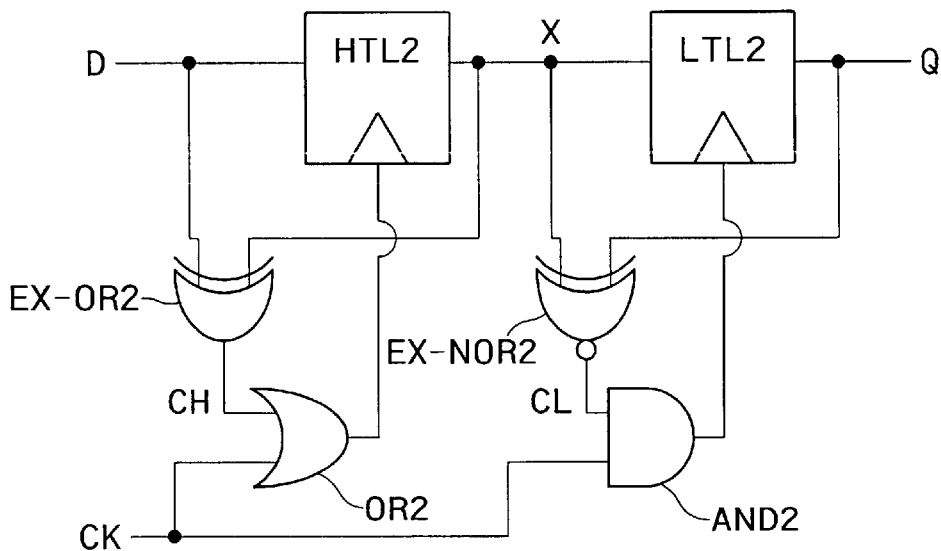
FIG. 6 shows a block diagram of a flip-flop circuit as a second embodiment according to the present invention.

FIG. 6 shows a block diagram of a flip-flop circuit as a second embodiment according to the present invention.

The flip-flop circuit as the second embodiment according to the present invention has a first latch circuit HTL2, the input node thereof being connected to an input D, the output node thereof being connected to a node X, which passes a signal therethrough while a high (first)-level first internal clock signal is being supplied to its clock-input node, whereas stores a signal while a low (second) -level first internal clock signal is being supplied to the clock-input node; a second latch circuit LTL2, the input node thereof being connected to the node X, the output node thereof being connected to an output Q, which passes a signal therethrough while a low-level second internal clock signal is being supplied to its clock-input node, whereas stores the signal while a high-level second internal clock signal is being supplied to the clock-input node; a 2-input EX-OR logic circuit EX-OR2 (a first comparator), one of the two inputs thereof receiving an input D, the other input thereof being connected to the node X; a 2-input OR logic circuit OR2 (a first clock controller), one of the two inputs thereof being connected to the output node CH of the EX-OR logic circuit EX-OR2, the other input thereof receiving a clock signal CK, which generates a first internal clock signal; an EX-NOR logic circuit EX-NOR2 (a second comparator), one of the two inputs thereof being connected to the node X, the other input thereof receiving an output Q; and a 2-input AND logic circuit AND2 (a second clock controller), one of the two inputs-thereof being connected to the output node CL of the EX-NOR logic circuit EX-NOR2, the other input thereof receiving the clock signal CK, which generates a second internal clock signal.

Figure 7:
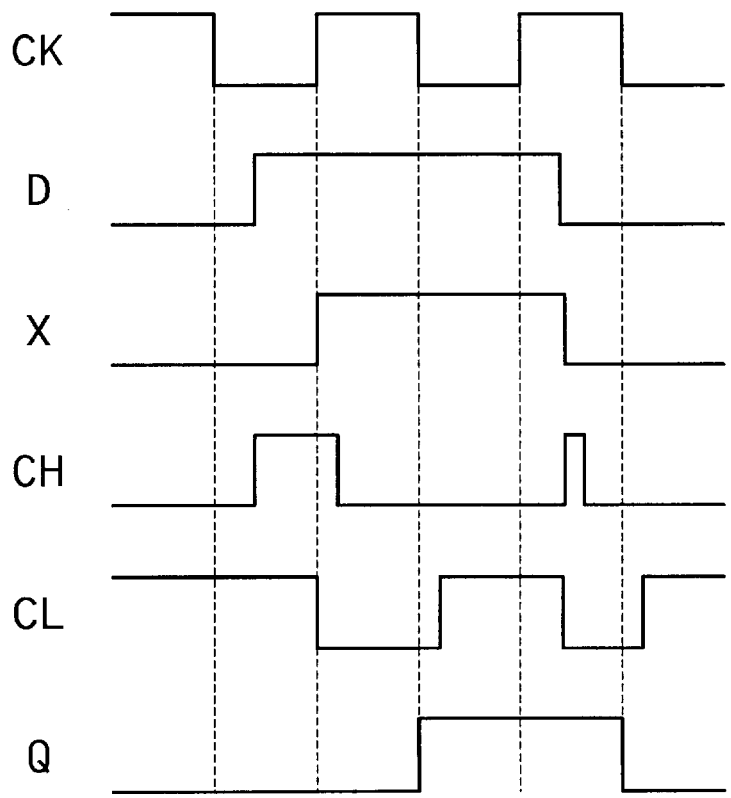
FIG. 7 shows a timing chart indicating an operation of the flip-flop circuit as the second embodiment of the present invention.

FIG. 7 shows a timing chart indicating an operation of the flip-flop circuit as the second embodiment of the present invention.

Disclosed below with reference to FIGS. 6 and 7 is the operation of the flip-flop circuit as the second embodiment of the present invention.

The EX-OR logic circuit EX-OR2 generates a low-level output at the output node CH when the input D and the node X have the same logic value, thus a low-level first internal clock signal being supplied to the first latch circuit HTL2. This gives the same logic value to the node X and the output Q, which causes the EX-NOR logic circuit EX-NOR2 to generate a high-level output at the output node CL, thus a high-level second internal clock signal being supplied to the second latch circuit LTL2. Therefore, logically-correct first and second internal clock signals to be supplied to the first and the second latch circuits HTL2 and LTL2, respectively, are blocked by the -OR logic circuit OR2 and the AND logic circuit AND2, each connected to the clock-input node of the corresponding latch circuit.

On the contrary, the EX-OR logic circuit EX-OR2 generates a high-level output at the output node CH when the input D and the node X have different logic values, thus the first internal clock signal supplied to the first latch circuit HTL2 being at the same level as the clock signal CK. A high-level clock signal CK gives the same logic value to the node X and the input D, thus the EX-OR logic circuit EX-OR2 generating a low-level output at the output node CH.

This results in different logic values at the node X and the output Q, thus the EX-NOR logic circuit EX-NOR2 generating a low-level output at the output node CL, which gives a signal level the same as the clock signal CK to the internal clock signal supplied to the second latch circuit LTL2. A low-level clock signal CK gives the same logic value to the node X and the output Q, thus an input D being generated as an output Q as being synchronized with a falling moment of the clock signal CK.

As disclosed above, the flip-flop circuit as the second embodiment of the present invention perform a usual D-type flip-flop operation while blocks logically-correct clock signals in front of the latch circuits constituting a flip-flop, when the input D and the output Q have the same logic value, thus eliminating unnecessary operations and hence achieving low-power consumption.

Figure 8:
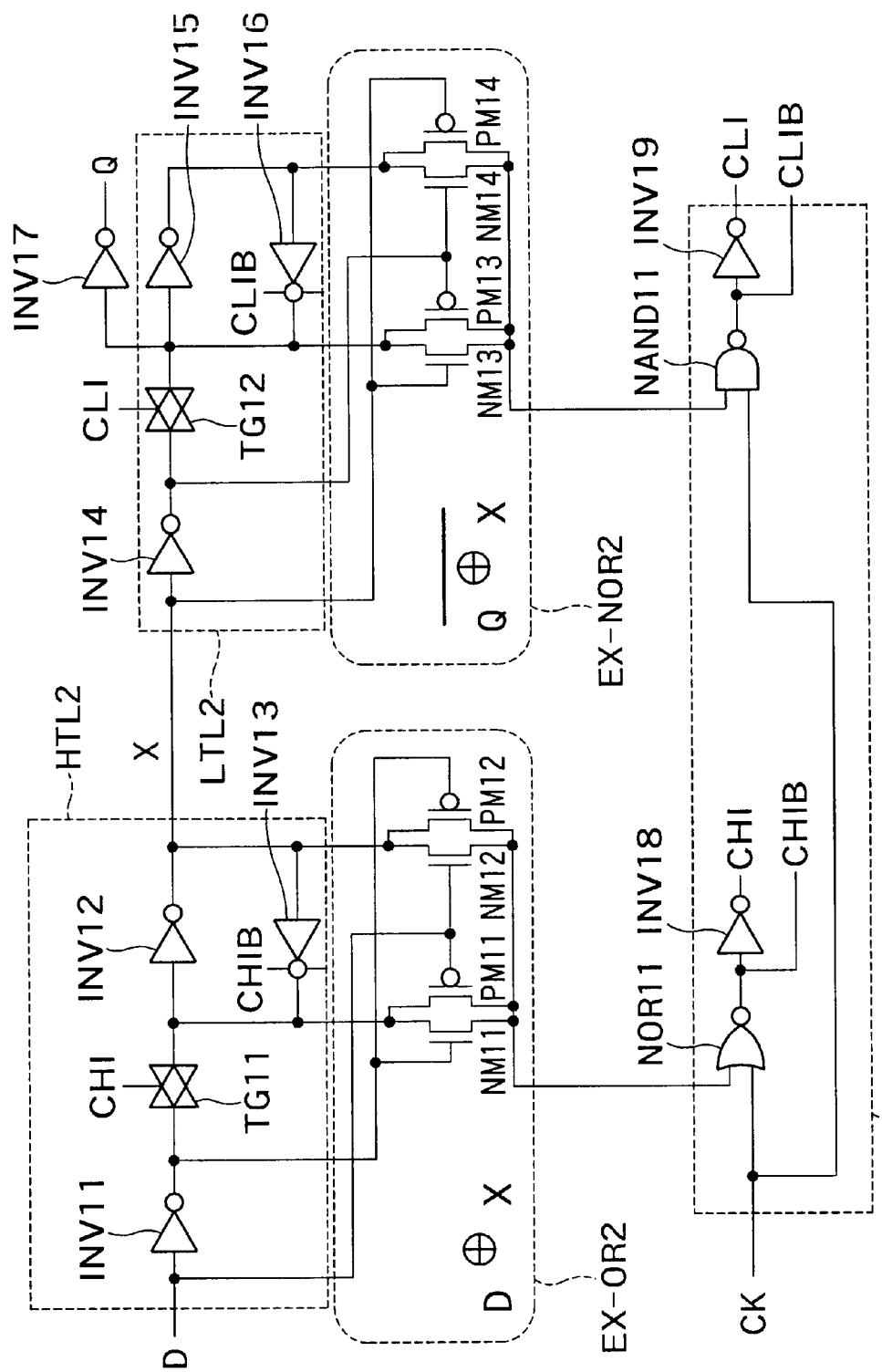
FIG. 8 is a detailed circuit diagram of the flip-flop circuit as the second embodiment of the present invention.

FIG. 8 is a detailed circuit diagram of the flip-flop circuit as the second embodiment of the present invention.

The detailed circuit diagram of the flip-flop circuit as the second embodiment of the present invention shown in FIG. 8 has the first and the second latch circuits HTL2 and LTL2, the EX-OR logic circuit EX-OR2, the EX-NOR logic circuit EX-NOR2 and also a clock-control circuit CLK-CTRL2, in accordance with the flip-flop circuit as the second embodiment of the present invention shown in FIG. 6.

The first latch circuit HTL2 has a first inverter INV11, the input node thereof being connected to an input D; a first transmission gate TG11 connected in series to the output node of the first inverter INV11; a second inverter INV12 connected in series to the output node of the first transmission gate TG11, the output of the second inverter INV2 being connected to a node X; and a first clocked inverter INV13 interconnected with the second inverter INV12 in which the output node of the second inverter INV12 is connected to the input node of the first clocked inverter INV13 and the output node of the first clocked inverter INV13 is connected to the second inverter INV12.

The second latch circuit LTL2 has a third inverter INV14, the input node thereof being connected to the node X; a second transmission gate TG12 connected in series to the output node of the third inverter INV14; a fourth inverter INV15 connected in series to the output node of the second transmission gate TG12; a second clocked inverter INV16 interconnected with the fourth inverter INV15 in which the output node of the fourth inverter INV15 is connected to the input node of the second clocked inverter INV16 and the output node of. the second clocked inverter INV16 is connected to the fourth inverter INV15; and a seventh inverter INV17, the output node thereof being connected to an output Q.

An output Q is generated at the output node of the seventh inverter INV17 for steady output Q supply, although it can be generated at the output node of the fourth inverter INV15. The seventh inverter INV17 may be omitted when in arrangements for generating an output Q at the output node of the fourth inverter INV15.

The EX-OR logic circuit EX-OR2 has a pair of a first N-channel MOS transistor NM11 and a first P-channel MOS transistor PM11 connected in parallel, the drain of the MOS transistor NM11 and also the source of the MOS transistor PM11 being connected to the output node of the first transmission gate TG11, the gate of the MOS transistor NM11 being connected to the output node of the first inverter INV11, the gate of the MOS transistor PM11 being connected to the input D; and another pair of a second N-channel MOS transistor NM12 and a second P-channel MOS transistor PM12 connected in parallel, the drain of the MOS transistor NM12 and also the source of the MOS transistor PM12 being connected to the node X, or the output node of the second inverter INV12, the gate of the MOS transistor NM12 being connected to the input D, the gate of the MOS transistor PM12 being connected to the output node of the first inverter INV11.

The EX-OR logic circuit EX-OR2 performs an exclusive-OR operation to the signals at the input D and the node X.

The EX-NOR logic circuit EX-NOR2 has a pair of a third N-channel MOS transistor NM13 and a third P-channel MOS transistor PM13 connected in parallel, the drain of the MOS transistor NM13 and also the source of the MOS transistor PM13 being connected to the output node of the second transmission gate TG12, the gate of the MOS transistor NM13 being connected to the input node of the third inverter INV14, the gate of the MOS transistor PM13 being connected to the output node of the third inverter INV14; and another pair of a fourth N-channel MOS transistor NM14 and a fourth P-channel MOS transistor PM14 connected in parallel, the drain of the MOS transistor NM14 and also the source of the MOS transistor PM14 being connected to the,output node of the fourth inverter INV15 (or allowed to be connected to the output Q), the gate of the MOS transistor NM14 being connected to the output node of the third inverter INV14, the gate of the MOS transistor PM14 being connected to the input node of the third inverter INV14.

The EX-NOR logic circuit EX-NOR2 performs an exclusive-NOR operation to the signals at the node X and the output Q.

The clock-control circuit CLK-CTRL2 has a NOR logic circuit NOR11, one of the two inputs thereof receiving a clock signal CK, the other input thereof being connected to the source of the first N-channel MOS transistor NM11, the drain of the first P-channel MOS transistor PM11, the source of the second N-channel MOS transistor NM12 and the drain of the second P-channel MOS transistor PM12; a fifth inverter INV18 connected in series to the output node of the NOR logic circuit NOR11; a NAND logic circuit NAND11, one of the two inputs thereof receiving the clock signal CK, the other input thereof being connected to the source of the third N-channel MOS transistor NM13, the drain of the third P-channel MOS transistor PM13, the source of the fourth N-channel MOS transistor NM14 and the drain of the fourth P-channel MOS transistor PM14; and a sixth inverter INV19 connected in series to the output node of the NAND logic circuit NAND11.

A first internal clock signal CHI is generated at the output node of the fifth inverter INV18. A first inverted internal clock signal CHIB is generated at the output node of the NOR logic circuit NOR11. A second internal clock signal CLI is generated at the output node of the sixth inverter INV19. Moreover, a second inverted internal clock signal CLIB is generated at the output node of the NAND logic circuit NAND11.

The first internal clock signal CHI is supplied to N-channel MOS transistors of the first transmission gate TG11 and also P-channel MOS transistors of the first clocked inverter INV13.

The first inverted internal clock signal CHIB is supplied to N-channel MOS transistors of the first clocked inverter INV13 and also P-channel MOS transistors of the first transmission gate TG11.

The second internal clock signal CLI is supplied to N-channel MOS transistors of the second transmission gate TG12 and also P-channel MOS transistors of the second clocked inverter INV16. The second inverted internal clock signal CLIB is supplied to N-channel MOS transistors of the second clocked inverter INV16 and also P-channel MOS transistors of the second transmission gate TG12.

Shown in FIG. 8 are the internal clock and inverted internal clock signals supplied only to the N-channel MOS transistors for brevity.

The flip-flop circuit as the second embodiment of the present invention shown in FIG. 8 operates in the same way as the basic operation of the counterpart shown in FIG. 6. Moreover, the flip-flop circuit shown in FIG. 8 is a detailed circuit for the second embodiment of the present invention shown in FIG. 6, and hence any modifications can be made to the configuration as long as meeting the same operational requirements.

As disclosed in detail, a semiconductor integrated circuit according to the present invention is equipped with a clock-control circuit with a simple configuration having a limited number of transistors, that brings a signal-transfer circuit in a halt by holding internal clock signals at a specific level when input and output signals to and from the signal-transfer circuit have the same logic value, whereas operates the signal-transfer circuit by supplying logically correct internal clock signals thereto when input and output signals have different logic values.

The present invention thus provides a simple-structured flip-flop circuit having a low-power consuming signal-transfer circuit.

What is claimed is:

1. A semiconductor integrated circuit comprising:
   a first latch to pass or store a signal in accordance with a logic value of a first internal clock signal;
   a second latch connected in series to the first latch, to store or pass a signal in accordance with a logic value of a second internal clock signal, with operational characteristics, regarding a relation between passing or storing operations and logic values of the second internal clock signal, which are an inversion of operational characteristics regarding the same relation of the first latch;
   a first comparator to compare signal logic values at signal-input and -output nodes of the first latch;
   a second comparator to compare signal logic values at signal-input and -output nodes of the second latch;
   a first clock controller to generate a signal as the first internal clock signal having a specific logic value for storing the signal when the signal-input and -output nodes of the first latch have a specific same signal logic value whereas generate a specific clock signal as the first internal clock signal when the signal-input and -output nodes of the first latch have different signal logic values, under a result of comparison by the first comparator; and
   a second clock controller to generate a signal as the second internal clock signal having a specific logic value for storing the signal as the second internal clock signal when the signal-input and -output nodes of the second latch have a specific same signal logic value whereas generate the specific clock signal when the signal-input and -output nodes of the second latch have different signal logic values, as the second internal clock signal, under a result of comparison by the second comparator.

2. The semiconductor integrated circuit according to claim 1 wherein the first latch passes the signal while the first internal clock signal is being at a first level whereas stores the signal while the first internal clock signal is being at a second level and the second latch passes the signal at the input node of the second latch while the second internal clock signal is being at the second level whereas stores the signal at the input node of the second latch while the second internal clock signal is being at the first level.

3. The semiconductor integrated circuit according to claim 2 wherein the first comparator includes an exclusive-NOR logic circuit, the second comparator includes an exclusive-OR logic circuit, the first clock controller includes an OR logic circuit and the second clock controller includes an AND logic circuit.

4. The semiconductor integrated circuit according to claim 2 wherein the first comparator includes an exclusive-OR logic circuit, the second comparator includes an exclusive-NOR logic circuit, the first clock controller includes an OR logic circuit and the second clock controller includes an AND logic circuit.

5. A semiconductor integrated circuit comprising:
   a first latch having a clock-input node, an input node connected to an input D and an output node connected to a node X, to pass a signal at the input node of the first latch while a first internal clock signal supplied to the clock-input node is being at a first level whereas store the signal at the input node of the first latch while the first internal clock signal is being at a second level;
   a second latch having a clock-input node, an input node connected to the node X and an output node connected to an output Q, to pass a signal at the input node of the second latch while a second internal clock signal supplied to the clock-input node is being at the second level whereas store the signal at the input node of the second latch while the second internal clock signal is being at the first level;
   a first comparator having an input receiving the input D and another input connected to the node X;
   a first clock controller having an input connected to an output node of the first comparator and another input receiving a specific clock signal, to generate the first internal clock signal;
   a second comparator having an input connected to the node X and another input receiving the output Q; and
   a second clock controller having an input connected to an output node of the second comparator and another input receiving the specific clock signal, to generate the second internal clock signal.

6. The semiconductor integrated circuit according claim 5 wherein
   the first latch includes:
      a first inverter, an input node thereof being connected to the input D;
      a first transmission gate connected in series to an output node of the first inverter;
      a second inverter connected in series to an output node of the first transmission gate, an output node of the second inverter being connected to the node X; and
      a first clocked inverter interconnected with the second inverter in which the output node of the second inverter is connected to an input node of the first clocked inverter and an output node of the first clocked inverter is connected to an input node of the second inverter, and the second latch includes:
a third inverter, an input node thereof being connected to the node X;
a second transmission gate connected in series to an output node of the third inverter;
a fourth inverter connected in series to an output node of the second transmission gate; and
a second clocked inverter interconnected with the fourth inverter in which an output node of the fourth inverter is connected to an input node of the second clocked inverter and an output node of the second clocked inverter is connected to an input node of the fourth inverter.

7. The semiconductor integrated circuit according claim 6 wherein the first comparator includes:
a pair of a first N-channel MOS transistor and a first P-channel MOS transistor connected in parallel, a drain of the first N-channel MOS transistor and a source of the first P-channel MOS transistor being connected to the output node of the first transmission gate, a gate of the first N-channel MOS transistor being connected to the output node of the first inverter, a gate of the first P-channel MOS transistor being connected to the input D; and
a pair of a second N-channel MOS transistor and a second P-channel MOS transistor connected in parallel, a drain of the second N-channel MOS transistor and a source of the second P-channel MOS transistor being connected to the node X, a gate of the second N-channel MOS transistor being connected to the input D, a gate of the second P-channel MOS transistor being connected to the output node of the first inverter, and the second comparator includes:
a pair of a third N-channel MOS transistor and a third P-channel MOS transistor connected in parallel, a drain of the third N-channel MOS transistor and a source of the third P-channel MOS transistor being connected to the output node of the second transmission gate, a gate of the third N-channel MOS transistor being connected to the input node of the third inverter, a gate of the third P-channel MOS transistor being connected to the output node of the third inverter, and
a pair of a fourth N-channel MOS transistor and a fourth P-channel MOS transistor connected in parallel, a drain of the fourth N-channel MOS transistor and a source of the fourth P-channel MOS transistor being connected to the output node of the fourth inverter, a gate of the fourth N-channel MOS transistor being connected to the output node of the third inverter, a gate of the fourth P-channel MOS transistor being connected to the input node of the third inverter.

8. The semiconductor integrated circuit according claim 7 wherein the first clock controller includes:
a NOR logic circuit, an input thereof receiving the specific clock signal, another input thereof being connected to a source of the first N-channel MOS transistor, a drain of the first P-channel MOS transistor, a source of the second N-channel MOS transistor and a drain of the second P-channel MOS transistor, a first inverted internal clock signal, that is a logically inverted version of the first internal clock signal, being supplied from an output node of the NOR logic circuit to at least one N-channel MOS transistor of the first clocked inverter and at least one P-channel MOS transistor of the first transmission gate; and
a fifth inverter connected to the output node of the NOR logic circuit, the first internal clock signal being supplied from an output node of the fifth inverter to at least one N-channel MOS transistor of the first transmission gate and at least one P-channel MOS transistor of the first clocked inverter, and the second clock controller includes:
a NAND logic circuit, an input thereof receiving the specific clock signal, another input thereof being connected to a source of the third N-channel MOS transistor, a drain of the third P-channel MOS transistor, a source of the fourth N-channel MOS transistor and a drain of the fourth P-channel MOS transistor, a second inverted internal clock signal, that is a logically inverted version of the second internal clock signal, being supplied from an output node of the NAND logic circuit to at least one N-channel MOS transistor of the second clocked inverter and at least one P-channel MOS transistor of the second transmission gate; and
a sixth inverter connected in series to the output node of the NAND logic circuit, the second internal clock signal being supplied from an output node of the sixth inverter to at least one N-channel MOS transistor of the second transmission gate and at least one P-channel MOS transistor of the sixth inverter.

9. The semiconductor integrated circuit according to claim 6, the second latch further including a seventh inverter connected in series to the output node of the second transmission gate, an output node of the seventh inverter being connected to the output Q.

* * * * *